United States Patent

Hatakeyama

Patent Number: 5,334,979
Date of Patent: Aug. 2, 1994

[54] POWER CONTROLLER

[75] Inventor: Naoto Hatakeyama, Tokyo, Japan

[73] Assignee: NEC Corporation, Japan

[21] Appl. No.: 938,422

[22] Filed: Aug. 31, 1992

[30] Foreign Application Priority Data

Aug. 30, 1991 [JP] Japan .................. 3-220507

[51] Int. Cl.⁵ .............. H03M 1/62; H03M 1/84; H03M 1/88
[52] U.S. Cl. ........................ 341/138; 330/129
[58] Field of Search ............. 341/138, 140; 330/279, 330/127–129

[56] References Cited

U.S. PATENT DOCUMENTS

| | | | |
|---|---|---|---|
| 3,999,181 | 12/1976 | Hirsch | 341/138 |
| 4,363,024 | 12/1982 | Brokaw | 341/138 |
| 4,476,437 | 10/1984 | Fujiwara | 330/138 |
| 4,546,326 | 10/1985 | Van Uffelen et al. | 330/134 |
| 5,126,686 | 6/1992 | Tam | 330/134 |
| 5,128,629 | 7/1992 | Trinh | 330/129 |
| 5,132,634 | 7/1992 | Suarez | 330/129 |
| 5,159,283 | 10/1992 | Jensen | 330/129 |
| 5,196,806 | 3/1993 | Ichihara | 330/137 |

FOREIGN PATENT DOCUMENTS

| | | |
|---|---|---|
| 0135154 | 8/1984 | European Pat. Off. |
| 0446073 | 3/1991 | European Pat. Off. |
| 60-244107 | 12/1985 | Japan .................. 330/279 |
| 1108370 | 1/1966 | United Kingdom |
| 2238435 | 10/1990 | United Kingdom |

Primary Examiner—Marc S. Hoff
Attorney, Agent, or Firm—Ostrolenk, Faber, Gerb & Soffen

[57] ABSTRACT

According to this invention, a power controller includes a power amplifier, a detector, a digital/analog converter, and a power control unit. The amplifier amplifies RF signal input on the basis of an applied control voltage to output a RF power. The detector detects the RF power from the power amplifier to output a detection voltage. The digital/analog converter converts externally input digital data into a reference voltage to output the reference voltage. The power control unit compares the reference voltage from the digital/analog converter means with the detection voltage from the detector to output the control voltage. The digital/analog converter has conversion characteristics in which a rate of change in reference voltage corresponding to a change in digital data is set to be low in a high sensitive output region of a feedback system constituted by the power amplifier, the detector, and the power control circuit and is set to be high in a low sensitive output region.

4 Claims, 2 Drawing Sheets

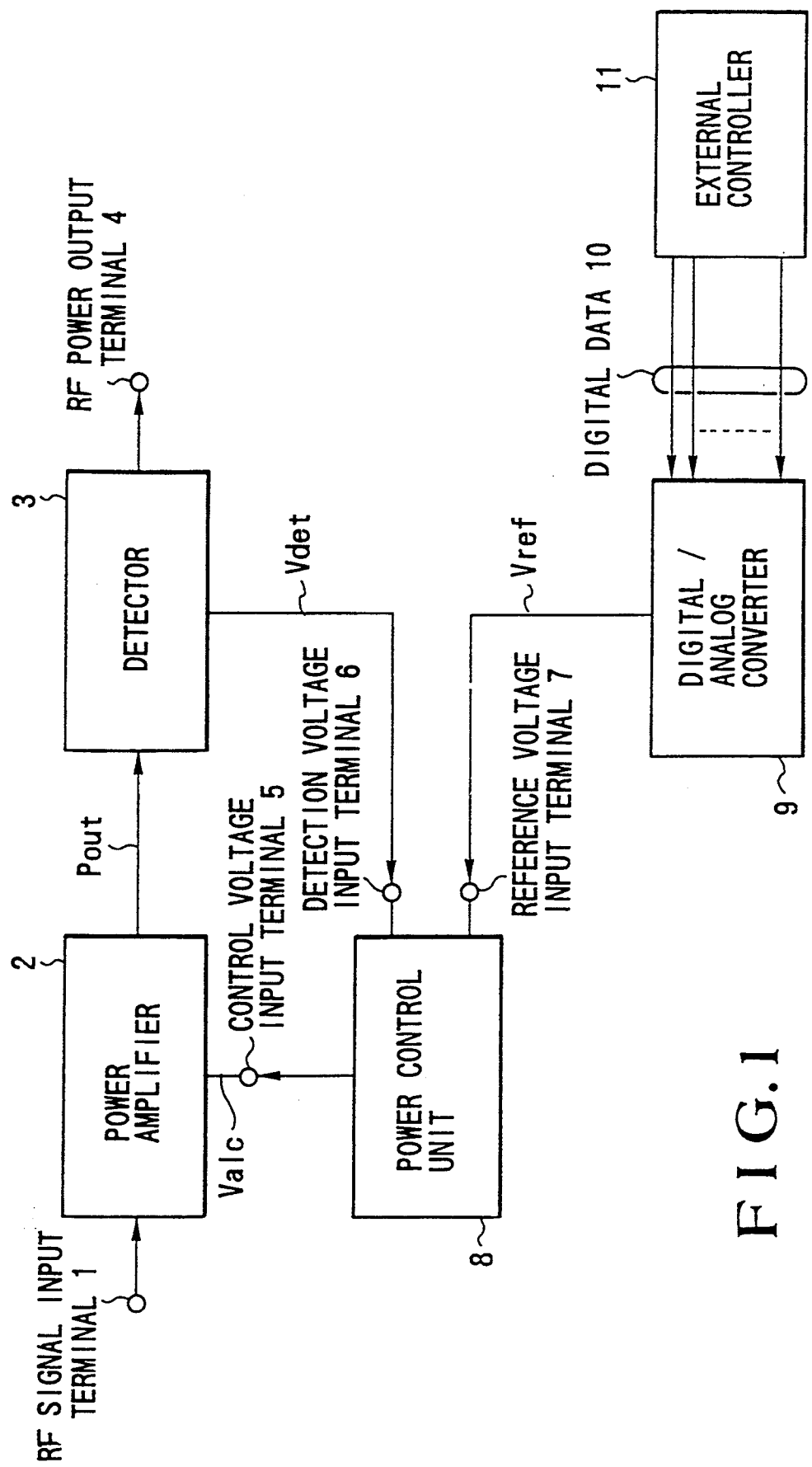
F I G. 1

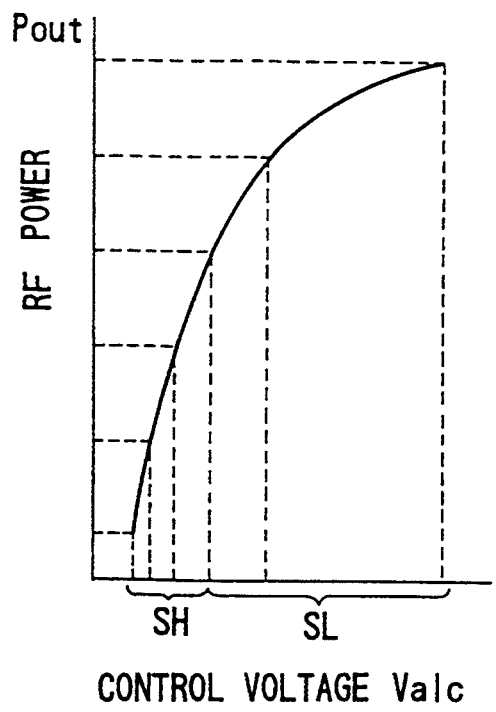
F I G. 2A
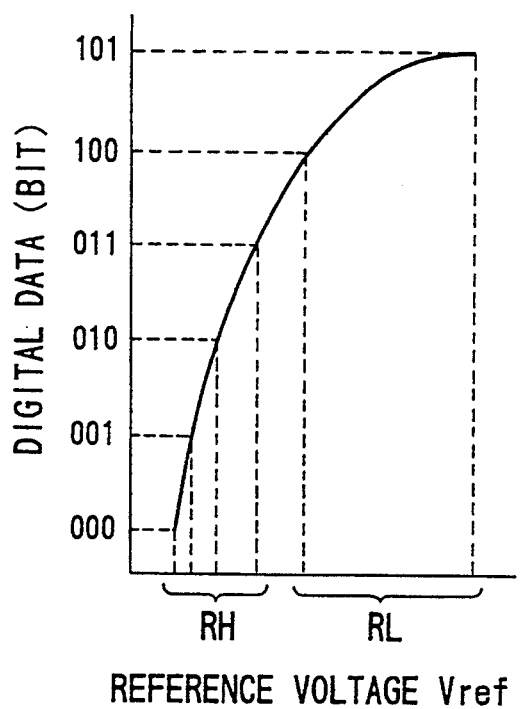
F I G. 2B
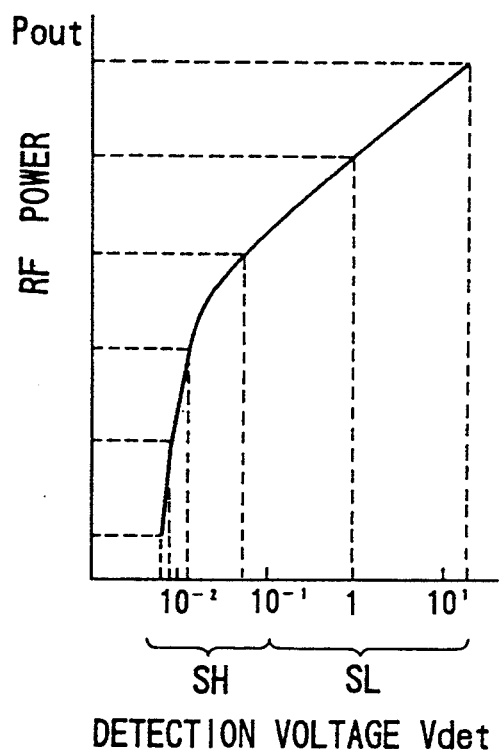
F I G. 3A
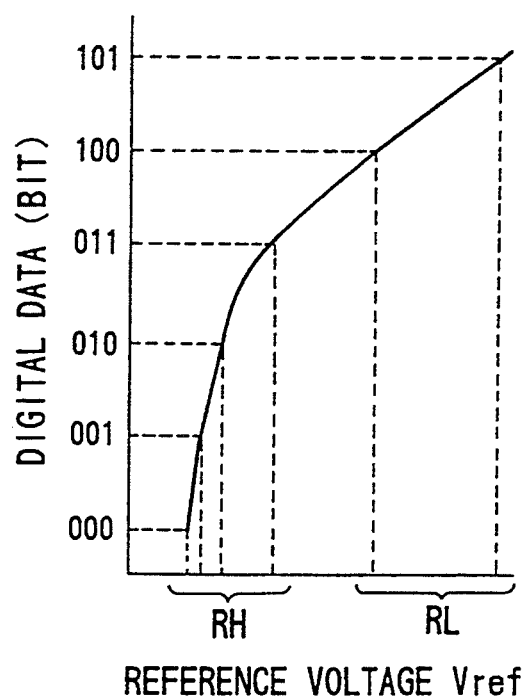
F I G. 3B

5,334,979

POWER CONTROLLER

BACKGROUND OF THE INVENTION

The present invention relates to a power controller for mobile radio communication and, more particularly, to a power controller for controlling the RF (radio frequency) power of a an RF power amplifier such as a mobile telephone unit.

A conventional power controller includes a detector for extracting a part of a RF power output from a power amplifier and detecting the power, a power control unit for comparing the detection voltage with a predetermined reference voltage to control a feedback operation of the RF power output, and a digital/analog converter for generating the reference voltage in response to a digital signal output from an external circuit, thereby setting a target output power at a constant voltage.

In the above conventional power controller, a change in RF power caused by a change in control voltage of the power amplifier itself tends to be small at about 80 to 90% of a rated output and to be large at about 20 to 30% of the rated output, therefore, causing a large difference in sensitivity.

For this reason, in the digital/analog converter for outputting a reference voltage, its resolution must be increased to match a region having a high sensitivity. Since this resolution is kept unchanged in a region having a low sensitivity, bits are excessively used due to multi-stage power-down. In addition, a change in detection voltage output caused by a change in RF power passing through the detector is on the order of several hundreds mV at about 80 to 90% of the rated output, and the change in detection voltage output is on the order of several mV at about 20 to 30% of the rated output with the same rate of the RF power. For this reason, a difference in sensitivity occurs, and the same problem as described above is posed.

SUMMARY OF THE INVENTION

It is an object of the present invention to provide a power controller capable of decreasing the number of bits used for a digital/analog converter.

It is another object of the present invention to provide a power controller capable of obtaining a predetermined stable RF power.

It is still another object of the present invention to provide a power controller having a constant sensitivity regardless of a change in level of a RF power.

In order to achieve the above objects, according to the present invention, there is provided a power controller comprising power amplifying means for amplifying a an RF signal input on the basis of an applied control voltage to output an RF power, detecting means for detecting the RF power from the power amplifying means to output a detection voltage, digital/analog converting means for converting externally input digital data into a reference voltage to output the reference voltage, and power control means for comparing the reference voltage form the digital/analog converting means with the detection voltage from the detecting means to output the control voltage, wherein the power controller having conversion characteristics in which a rate of change in reference voltage corresponding to a change in digital data is set to be low in a high sensitive output region of a feedback system including the power amplifying means, the detecting means, and the power control means and is set to be high in a low sensitive output region.

BRIEF DESCRIPTION OF THE DRAWINGS

FIG. 1 is a block diagram showing a power controller according to an embodiment of the present invention;

FIG. 2A is a graph showing characteristics of a power amplifier of a power controller according to the present invention;

FIG. 2B is a graph showing characteristics of a digital/analog converter;

FIG. 3A is a graph showing characteristics of a detector of a power controller according to another embodiment of the present invention; and FIG. 3B is a graph showing characteristics of a digital/analog converter of the power controller according to the embodiments shown in FIG. 3A.

DESCRIPTION OF THE PREFERRED EMBODIMENT

An embodiment of the present invention will be described below with reference to the accompanying drawings. FIG. 1 shows a power controller according to an embodiment of the present invention.

In FIG. 1, the power controller includes an RF signal input terminal 1 for receiving an RF signal, a power amplifier 2 for receiving the RF signal from the RF signal input terminal 1 and amplifying the RF signal on the basis of an applied control voltage Valc to output an RF power Pout, a detector 3 for detecting the RF power Pout from the power amplifier 2 to output a detection voltage Vdet, a digital/analog converter 9 for parallelly receiving digital data 10 consisting of a plurality of bits output from an external controller 11 to output a reference voltage Vref, and a power control unit 8 for comparing the reference voltage Vref from the digital/analog converter 9 with the detection voltage Vdet from the detector 3 to output the control voltage Valc to the power amplifier 2. Reference numeral 4 denotes a high-frequency power output terminal; 5, a control voltage input terminal; 6, a detection voltage input terminal; and 7, a reference voltage input terminal.

As the characteristic feature of the present invention, the conversion characteristic curve of the digital/analog converter 9 have nonlinearity which is close to the characteristic curve of the RF power Pout with reference to the control voltage Valc in the power amplifier 2.

An operation of the power controller with the above arrangement will be described below. FIGS. 2A and 2B show characteristics of the power amplifier and the digital analog converter in the power controller according to the present invention.

In FIG. 1, a feedback control operation is performed by the power amplifier 2, the detector 3, and the power control unit 8 in the same manner as in a conventional power controller. The power controller of this embodiment is constituted by adding the digital/analog converter 9 having characteristics (to be described later). The external controller 11 sets a required value of the RF power Pout as an independent variable of the system. The digital/analog converter 9 converts the digital data 10 into the reference voltage Vref on the basis of predetermined conversion characteristics (to be described later) to output it to the power control unit 8.

FIG. 2A shows characteristics of the RF power Pout with respect to the control voltage Valc in the power amplifier 2. FIG. 2B shows characteristics of the reference voltage Vref with respect to the digital data 10 in the digital/analog converter 9.

In correspondence with a high sensitivity region SH in the characteristics of FIG. 2A, an output from the digital/analog converter 9 increases the resolution of each bit as a function of the reference voltage Vref as indicated by RH in FIG. 2B. In addition, in correspondence with a low sensitivity region SL in characteristics of FIG. 2A, the output from the digital/analog converter 9 decreases the resolution of each bit as a function of the reference voltage Vref as indicated by RL in FIG. 2B.

That is, the conversion characteristic of the digital/analog converter 9 are set such that the rate of change in the reference voltage Vref corresponding to the change in digital data is set to be low in the high sensitivity region SH of the power amplifier 2 and is set to be high in the low sensitivity region SL.

FIGS. 3A and 3B show characteristics of a detector and a digital/analog converter of a power controller according to another embodiment of the present invention. FIG. 3A shows characteristics of a high-frequency power Pout passing through a detector 3 as a function of a detection voltage Vdet shown in FIG. 1. FIG. 3B shows characteristics of a reference voltage Vref as a function of digital data 10 in a digital/analog converter 9.

In correspondence with a high sensitivity region SH in the characteristics of FIG. 3A, an output from the digital/analog converter 9 increases the resolution of each bit as a function of the reference voltage Vref as indicated by RH in FIG. 3B. In addition, in correspondence with a low sensitivity region SL in characteristics of FIG. 3A, the output from the digital/analog converter 9 decreases the resolution of each bit as a function of the reference voltage Vref as indicated by RL in FIG. 3B.

That is, the conversion characteristics of the digital/analog converter 9 are set such that the rate of change in the reference voltage Vref corresponding to the change in digital data is set to be low in the high sensitivity region SH of the detector 3 and is set to be high in the low sensitivity region SL.

As described above, since the characteristics of the power amplifier 2 shown in FIG. 2A are approximated to those of the detector 3 shown in FIG. 3A, the conversion characteristics of the digital/analog converter 9 is matched with the characteristics of the power amplifier 2 or the detector 3.

That is, the conversion characteristics of the digital/analog converter 9 are set such that the rate of change in the reference voltage Vref corresponding to the change in digital data is set to be low in the high sensitivity region of a feedback system including a power amplifier 2, the detector 3, and a power control unit 8 and is set to be high in the low sensitivity region SL.

As described above, according to the present invention, bits need not consumed exceeding the required number of bits by the digital/analog converter, a desired constant RF power can be advantageously obtained by a small number of bits.

What is claimed is:

1. A power controller comprising:
   a power amplifying means for amplifying an RF signal input on the basis of an applied control voltage to output an RF power signal;
   detecting means for detecting the RF power signal form said power amplifying means to output a detection voltage;
   digital/analog converting means, having nonlinear conversion characteristics approximated to characteristics of the detection voltage corresponding tot he RF power of said detection means, for converting externally input digital data of a small number of bits into a reference voltage to output the reference voltage; and
   power control means for comparing the reference voltage from said digital/analog converting means with the detection voltage from said detecting means to output the control voltage;
   wherein said digital/analog converting means had conversion characteristics in which a rate of change in reference voltage corresponding to a change of the input in digital data is set to be low in a high sensitive output region of a feedback system including said power amplifying means, said detecting means, and said power control means, to increase a resolution of each bit of the input digital data, and is set to be high in a low sensitive output region of the feedback system to decrease the resolution of each bit of the input digital data.

2. A power controller according to claim 1, further comprising external control means for outputting the digital data to said digital/analog converting means, the input digital data being set to obtain a required value of the RF power signal from said detection means as an independent variable of the feedback system.

3. A power controller comprising:
   power amplifying means for amplifying an RF signal input on the basis of an applied control voltage to output an RF power signal;
   detecting means for detecting the RF power from said amplifying means to output a detection voltage;
   digital/analog conversion means, having nonlinear conversion characteristics approximated to characteristics of the RF power corresponding to the control voltage of said power amplifying means, for converting externally input digital data of a small number of bits into a reference voltage on the basis of the conversion characteristics and outputting the reference voltage; and
   power control means for comparing the reference voltage form said digital/analog converting means with the detection voltage from said detecting means to output the control voltage;
   wherein said digital/analog converting means has conversion characteristics in which a rate of change in reference voltage corresponding to a change of the input digital data is set to be low in a high sensitive output region of a feedback system including said power amplifying means, said detecting means, and said power control means, to increase a resolution of each bit of the input digital data, and is set to be high in a low sensitive output region of the feedback system to decrease the resolution of each bit of the input digital data.

4. A power controller according to claim 3, further comprising external control means for outputting the digital data to said digital/analog converting means, the input digital data being set to obtain a required value of the RF power signal from said detection means as an independent variable of the feedback system.

* * * * *